(12) United States Patent
Otsubo et al.

(10) Patent No.: US 10,491,188 B2
(45) Date of Patent: Nov. 26, 2019

(54) ELASTIC WAVE DEVICE

(71) Applicant: Murata Manufacturing Co., Ltd., Nagaokakyo-shi, Kyoto-fu (JP)

(72) Inventors: Ryo Otsubo, Nagaokakyo (JP); Kouhei Fujio, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 428 days.

(21) Appl. No.: 15/342,171

(22) Filed: Nov. 3, 2016

(65) Prior Publication Data

US 2017/0077897 A1 Mar. 16, 2017

Related U.S. Application Data

(63) Continuation of application No. PCT/JP2015/065770, filed on Jun. 1, 2015.

(30) Foreign Application Priority Data

Jun. 4, 2014 (JP) ................................ 2014-115610

(51) Int. Cl.
*H03H 9/02* (2006.01)
*H01L 41/18* (2006.01)
*H03H 9/13* (2006.01)

(52) U.S. Cl.
CPC ......... *H03H 9/02574* (2013.01); *H01L 41/18* (2013.01); *H03H 9/02881* (2013.01); *H03H 9/02897* (2013.01); *H03H 9/131* (2013.01)

(58) Field of Classification Search
CPC combination set(s) only.
See application file for complete search history.

(56) References Cited

U.S. PATENT DOCUMENTS

| 2007/0018536 | A1 | 1/2007 | Kadota et al. |
| 2012/0194032 | A1* | 8/2012 | Kadota ............... H03H 9/02574 310/313 A |
| 2013/0285768 | A1* | 10/2013 | Watanabe ............ H03H 9/0222 333/193 |
| 2014/0139075 | A1* | 5/2014 | Iwamoto ............. H01L 41/0815 310/364 |

FOREIGN PATENT DOCUMENTS

| CN | 101741342 A | 6/2010 |
| CN | 103262410 A | 8/2013 |
| CN | 103718457 A | 4/2014 |
| WO | 2011/046117 A1 | 4/2011 |
| WO | 2012/086639 A1 | 6/2012 |
| WO | 2013/018604 A1 | 2/2013 |

OTHER PUBLICATIONS

Official Communication issued in corresponding International Application PCT/JP2015/065770, dated Jul. 14, 2015.

* cited by examiner

*Primary Examiner* — Bryan P Gordon
(74) *Attorney, Agent, or Firm* — Keating & Bennett, LLP

(57) ABSTRACT

An elastic wave device includes a high-acoustic-velocity film, a low-acoustic-velocity film, and a piezoelectric film stacked on a substrate in this order, and a bonding layer is disposed at any position from inside of the high-acoustic-velocity film to an interface between the low-acoustic-velocity film and the piezoelectric film. Alternatively, an elastic wave device includes a low-acoustic-velocity film and a piezoelectric film stacked on a high-acoustic-velocity substrate, and a bonding layer is located in the low-acoustic-velocity film or at an interface between the piezoelectric film and the low-acoustic-velocity film.

22 Claims, 5 Drawing Sheets

ELASTIC WAVE DEVICE

CROSS REFERENCE TO RELATED APPLICATIONS

This application claims the benefit of priority to Japanese Patent Application 2014-115610 filed on Jun. 4, 2014 and is a Continuation Application of PCT/JP2015/065770 filed on Jun. 1, 2015. The entire contents of each application are hereby incorporated herein by reference.

BACKGROUND OF THE INVENTION

1. Field of the Invention

The present invention relates to an elastic wave device having a structure in which a low-acoustic-velocity film and a high-acoustic-velocity film are stacked on a piezoelectric film.

2. Description of the Related Art

Elastic wave devices having a structure in which another material layer is stacked between a substrate and a piezoelectric film have been known. WO2012/086639 A1 discloses an elastic wave device including a high-acoustic-velocity film, a low-acoustic-velocity film, and a piezoelectric film stacked on a supporting substrate in this order. In this elastic wave device, the Q factor can be increased.

In WO2012/086639 A1, when the elastic wave device is produced, a supporting substrate is bonded to a multilayer body including a piezoelectric film, a low-acoustic-velocity film, and a high-acoustic-velocity film stacked on top of each other. This bonding can be performed by a method such as bonding by hydrophilization, activation bonding, atomic diffusion bonding, or metal diffusion bonding.

When the supporting substrate is bonded to other elements by the bonding method described in WO2012/086639 A1, many layers are formed on the side of the piezoelectric film, which sometimes causes warpage in the piezoelectric film because of stress of the formed layers. Therefore, sometimes ripples appear in the characteristics of the elastic wave device. Furthermore, an increase in the degree of warpage sometimes causes a fracture in the piezoelectric film during conveyance.

SUMMARY OF THE INVENTION

Preferred embodiments of the present invention provide an elastic wave device whose characteristics are not substantially degraded due to warpage and in which fractures are not likely to occur during conveyance or other handling.

An elastic wave device according to a preferred embodiment of the present invention includes a piezoelectric film; a low-acoustic-velocity film which is stacked on the piezoelectric film and in which an acoustic velocity of a bulk wave that propagates through the low-acoustic-velocity film is lower than an acoustic velocity of a bulk wave that propagates through the piezoelectric film; a high-acoustic-velocity film which is stacked on a surface of the low-acoustic-velocity film on a side opposite to the piezoelectric film and in which an acoustic velocity of a bulk wave that propagates through the high-acoustic-velocity film is higher than an acoustic velocity of an elastic wave that propagates through the piezoelectric film; a substrate directly or indirectly stacked on a surface of the high-acoustic-velocity film on a side opposite to the low-acoustic-velocity film; and a bonding layer disposed at any position from an inside of the high-acoustic-velocity film to an interface between the low-acoustic-velocity film and the piezoelectric film.

In an elastic wave device according to a preferred embodiment of the present invention, the bonding layer is located in the high-acoustic-velocity film, at an interface between the high-acoustic-velocity film and the low-acoustic-velocity film, in the low-acoustic-velocity film, or at the interface between the low-acoustic-velocity film and the piezoelectric film.

An elastic wave device according to a preferred embodiment of the present invention includes a piezoelectric film and a low-acoustic-velocity film which is stacked on the piezoelectric film and in which an acoustic velocity of a bulk wave that propagates through the low-acoustic-velocity film is lower than an acoustic velocity of a bulk wave that propagates through the piezoelectric film; a high-acoustic-velocity substrate which is directly or indirectly stacked on a surface of the low-acoustic-velocity film on a side opposite to the piezoelectric film and in which an acoustic velocity of a bulk wave that propagates through the high-acoustic-velocity substrate is higher than an acoustic velocity of an elastic wave that propagates through the piezoelectric film; and a bonding layer located in the low-acoustic-velocity film or at an interface between the piezoelectric film and the low-acoustic-velocity film.

In an elastic wave device according to a preferred embodiment of the present invention, the bonding layer is located in the high-acoustic-velocity substrate, at an interface between the high-acoustic-velocity substrate and the low-acoustic-velocity film, in the low-acoustic-velocity film, or at the interface between the low-acoustic-velocity film and the piezoelectric film.

In an elastic wave device according to a preferred embodiment of the present invention, the bonding layer includes a metal oxide or a metal nitride.

In an elastic wave device according to a preferred embodiment of the present invention, the bonding layer includes a Ti layer, and the Ti layer preferably has a thickness in a range of about 0.4 nm to about 2.0 nm, for example.

In an elastic wave device according to a preferred embodiment of the present invention, the Ti layer preferably has a thickness in a range of about 0.4 nm to about 1.2 nm, for example.

In an elastic wave device according to a preferred embodiment of the present invention, the piezoelectric film is made of $LiTaO_3$.

In an elastic wave device according to a preferred embodiment of the present invention, the low-acoustic-velocity film is made of silicon oxide.

In an elastic wave device according to a preferred embodiment of the present invention, the low-acoustic-velocity film is made of silicon oxide, the bonding layer is located in the low-acoustic-velocity film, the low-acoustic-velocity film includes a first low-acoustic-velocity layer located on a side of the bonding layer close to the piezoelectric film and a second low-acoustic-velocity layer located on a side of the bonding layer opposite to the piezoelectric film, and when an elastic wave used in the elastic wave device is assumed to have a wavelength λ, the first low-acoustic-velocity layer preferably has a thickness of about 0.12λ or more, for example.

In an elastic wave device according to a preferred embodiment of the present invention, the first low-acoustic-velocity layer preferably has a thickness of about 0.22λ or more, for example.

In an elastic wave device according to a preferred embodiment of the present invention, the high-acoustic-velocity film is made of aluminum nitride or silicon nitride.

In an elastic wave device according to a preferred embodiment of the present invention, the elastic wave device further includes an intermediate layer stacked between the high-acoustic-velocity film and the substrate.

According to an elastic wave device of the present invention, the bonding layer is located at any position from the inside of the high-acoustic-velocity film to the interface between the low-acoustic-velocity film and the piezoelectric film or located in the low-acoustic-velocity film or at the interface between the piezoelectric film and the low-acoustic-velocity film. Therefore, warpage is unlikely to occur in the formation of the bonding layer. Therefore, the electrical characteristics are not significantly degraded and fractures are unlikely to occur during conveyance or the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, specific preferred embodiments of the present invention will be described with reference to the attached drawings.

Figure 1A:
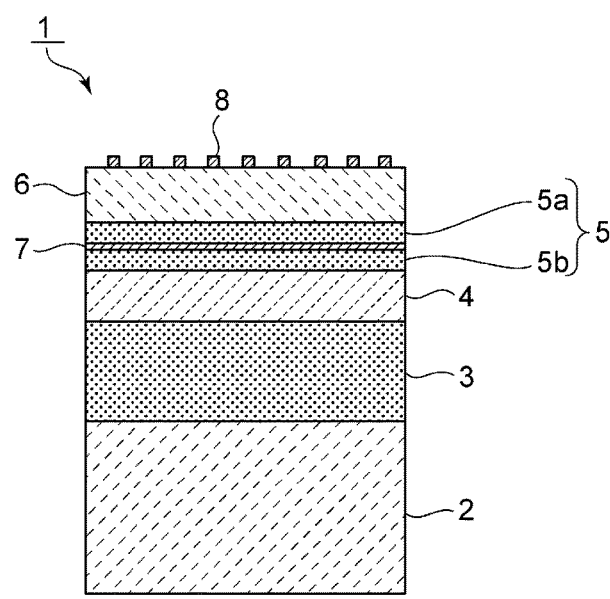
FIG. 1A is a schematic elevational cross-sectional view of an elastic wave device according to a first preferred embodiment of the present invention.

FIG. 1A is a schematic elevational cross-sectional view of an elastic wave device according to a first preferred embodiment of the present invention.

An elastic wave device 1 includes a supporting substrate 2. A first silicon oxide film 3 is stacked on the supporting substrate 2. A high-acoustic-velocity film 4 is stacked on the first silicon oxide film 3. A second silicon oxide film defining a low-acoustic-velocity film 5 is stacked on the high-acoustic-velocity film 4. As described later, the low-acoustic-velocity film 5 has a structure in which a low-acoustic-velocity layer 5a and a low-acoustic-velocity layer 5b are bonded to each other by a bonding layer 7. A piezoelectric film 6 is stacked on the low-acoustic-velocity film 5.

The low-acoustic-velocity film 5 refers to a film in which the acoustic velocity of a bulk wave that propagates through the film is lower than that of a bulk wave that propagates through the piezoelectric film 6. The high-acoustic-velocity film 4 refers to a film in which the acoustic velocity of a bulk wave that propagates through the film is higher than that of an elastic wave that propagates through the piezoelectric film 6.

Although various elastic waves having different acoustic velocities and modes are excited by an IDT electrode, the elastic wave that propagates through the piezoelectric film 6 refers to an elastic wave having a particular mode used to obtain characteristics as filters and resonators.

An IDT electrode 8 is disposed on the piezoelectric film 6. The supporting substrate 2 may be made of an appropriate material as long as the structure above the supporting substrate 2 is maintained. Examples of the materials include piezoelectrics, such as sapphire, $LiTaO_3$, $LiNbO_3$, and quartz; various ceramics, such as alumina, magnesia, silicon nitride, aluminum nitride, silicon carbide, zirconia, cordierite, mullite, steatite, and forsterite; dielectrics, such as glass; semiconductors, such as silicon and gallium nitride; and resins. In the present preferred embodiment, the supporting substrate 2 is preferably made of Si, for example.

The first silicon oxide film 3 is not necessarily included. That is, the high-acoustic-velocity film 4 may be directly stacked on the supporting substrate 2. Alternatively, as in the present preferred embodiment, the high-acoustic-velocity film 4 may also be indirectly stacked above the supporting substrate 2, that is, may be stacked above the supporting substrate 2 with the first silicon oxide film 3 interposed therebetween.

The high-acoustic-velocity film 4 confines an elastic wave in a portion defined by the piezoelectric film 6 and the low-acoustic-velocity film 5 so as to prevent leakage of the elastic wave to the structure below the high-acoustic-velocity film 4. In the present preferred embodiment, the high-acoustic-velocity film 4 is preferably made of aluminum nitride, for example. The high-acoustic-velocity film 4 may be made of a material, such as aluminum nitride, aluminum oxide, silicon carbide, silicon nitride, silicon oxynitride, a DLC film, or diamond as long as it confines the elastic wave. The high-acoustic-velocity film 4 may also be made of a composite material, such as a medium primarily including the above material or a medium primarily including a mixture of the above materials.

To confine the elastic wave in the portion defined by the piezoelectric film 6 and the low-acoustic-velocity film 5, the high-acoustic-velocity film 4 is preferably as thick as possible. The thickness of the high-acoustic-velocity film 4 may be about 0.5 times or more and preferably about 1.5 times or more the wavelength λ of a surface acoustic wave, for example.

The low-acoustic-velocity film 5 may be made of an appropriate dielectric material in which the acoustic velocity of a bulk wave is lower than that of a bulk wave that propagates through the piezoelectric film 6. Examples of the material include silicon oxide, glass, silicon oxynitride, tantalum oxide, compounds prepared by adding fluorine, carbon, or boron to silicon oxide, and media primarily including any of these materials.

As is clear from a non-limiting example of a production method described below, the bonding layer 7 is a portion formed by metal diffusion bonding and is preferably formed of Ti oxide in the present preferred embodiment.

A metal other than Ti may also be used. An example of such a metal is Al. Alternatively, the bonding layer 7 may be made of a metal, such as Ti or Al, instead of metal oxides. To achieve electrical insulation, a metal oxide or a metal nitride is preferable. In particular, an oxide or nitride of Ti is preferably used in order to achieve high bonding strength.

The piezoelectric film 6 is preferably made of LiTaO$_3$ in the present preferred embodiment. Alternatively, the piezoelectric film 6 may be made of a piezoelectric single crystal other than LiTaO$_3$.

The IDT electrode 8 is preferably made of Al in the present preferred embodiment. The IDT electrode 8 may be made of an appropriate metal material, such as Al, Cu, Pt, Au, Ag, Ti, Ni, Cr, Mo, W, or an alloy primarily including any of these metals. The IDT electrode 8 may have a structure in which a plurality of metal films made of these metals or alloys are stacked.

Figure 1B:
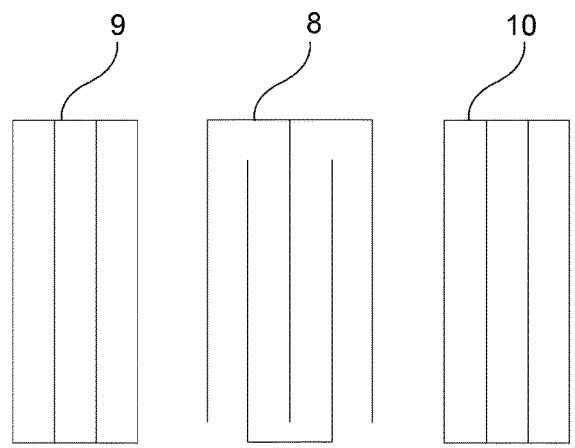
FIG. 1B is a schematic plan view illustrating an electrode structure of the elastic wave device.

Although schematically illustrated in FIG. 1A, an electrode structure illustrated in FIG. 1B is provided on the piezoelectric film 6. That is, the IDT electrode 8 and the reflectors 9 and 10 disposed on both sides of the IDT electrode 8 in a propagation direction of the elastic wave are provided. This defines a one-port elastic wave resonator. However, the electrode structure including the IDT electrode in preferred embodiments of the present invention is not particularly limited. The electrode structure may be modified so as to define a ladder filter, a longitudinally coupled resonator-type filter, or a lattice-type filter that includes an appropriate resonator or resonators in combination, or a transversal filter, for example.

In the elastic wave device 1 according to the present preferred embodiment, the low-acoustic-velocity film 5 is stacked on the high-acoustic-velocity film 4, and the piezoelectric film 6 is stacked on the low-acoustic-velocity film 5. Therefore, the Q factor is increased as in the elastic wave device described in WO2012/086639 A1. Furthermore, in the present preferred embodiment, the bonding layer 7 formed by metal diffusion is located in the low-acoustic-velocity film 5, and thus, warpage in unlikely to occur at the stage of a mother wafer in the production. Therefore, warpage of the piezoelectric film 6 and other elements is also unlikely to occur in the elastic wave device 1. This reduces or prevents degradation of the characteristics. In addition, fractures of the piezoelectric film 6, the supporting substrate 2, and other element are also unlikely to occur in a wafer conveying process during production and in the conveyance of products. This will be more specifically described by the following description of a non-limiting production method.

In the production of an elastic wave device 1, a first silicon oxide film 3 and a high-acoustic-velocity film 4 are stacked on a mother supporting substrate. Then, a second silicon oxide film is stacked on the high-acoustic-velocity film 4 in order to form a low-acoustic-velocity film 5, thereby obtaining a first multilayer body. In addition, a second multilayer body is provided in which an IDT electrode is formed on one surface of a piezoelectric film and a silicon oxide film is formed on the other surface of the piezoelectric film.

A Ti layer is stacked on each of a surface of the silicon oxide film of the first multilayer body and a surface of the silicon oxide film of the second multilayer body. Then, the Ti layers of the first and second multilayer bodies are bonded to each other under heating by being brought into contact with each other. In this case, Ti in both of the Ti layers bonded to each other interdiffuses. As a result, a bonding layer 7 is formed by metal diffusion bonding. Furthermore, oxygen is supplied to the Ti layers from the silicon oxide films. Therefore, the resulting bonding layer 7 is formed of Ti oxide. This achieves sufficient electrical insulation and firmly bonds the first and second multilayer bodies to each other.

The obtained mother multilayer body is cut into individual elastic wave devices 1. Thus, an elastic wave device 1 is obtained.

In the present preferred embodiment, since the bonding layer 7 is located in the low-acoustic-velocity film 5, warpage is unlikely to occur in the mother multilayer body.

The inventors of preferred embodiments of the present invention have discovered that when the elastic wave device described in WO2012/086639 A1 is obtained by performing metal diffusion bonding, warpage occurs in the piezoelectric film of a mother multilayer body. In the elastic wave device obtained by cutting a mother multilayer body in which warpage has occurred, ripples sometime appear in the electrical characteristics, such as the resonance characteristics. Herein, such warpage is eliminated by performing press forming under heating after the bonding. However, even if such a process for eliminating warpage is performed, the above electrical characteristics that have degraded do not recover. Therefore, it is believed that, for example, microcracks are formed in a piezoelectric thin film because of the warpage.

As a result of further studies on the warpage, the inventors of preferred embodiments of the present invention have discovered that when the structures of the first and second multilayer bodies are selected so that the bonding layer 7 is formed in the low-acoustic-velocity film 5 as in the present preferred embodiment, the warpage is effectively prevented.

In WO2012/086639 A1, a multilayer structure including a piezoelectric film, a low-acoustic-velocity film, and a high-acoustic-velocity film and a multilayer structure including a medium layer and a supporting substrate are bonded to each other. Consequently, a large membrane stress is applied to the piezoelectric film before bonding. Therefore, relatively large warpage tends to occur in the piezoelectric film at the stage of a mother multilayer body.

In contrast, only a silicon oxide film is stacked on the piezoelectric film in the second multilayer body of the present preferred embodiment, and thus, a large membrane stress is not applied to the piezoelectric film. Since stress applied to the piezoelectric film 6 is also small in a multilayer body obtained by performing bonding, warpage is not likely to occur. This prevents degradation of the electrical characteristics and also prevents the occurrence of fractures. This aspect will be described with reference to a specific experimental example.

A one-port elastic wave resonator was produced as the above elastic wave device 1. The number of pairs of electrode fingers of an IDT electrode was 100, the intersecting width of electrode fingers was about 20λ, and the wavelength determined by a pitch of electrode fingers was about 2.0 μm. The number of electrode fingers in reflectors 9 and 10 was 20. The IDT electrode 8 and the reflectors 9 and 10 were formed of Al and had a thickness of about 160 nm.

Figure 2:
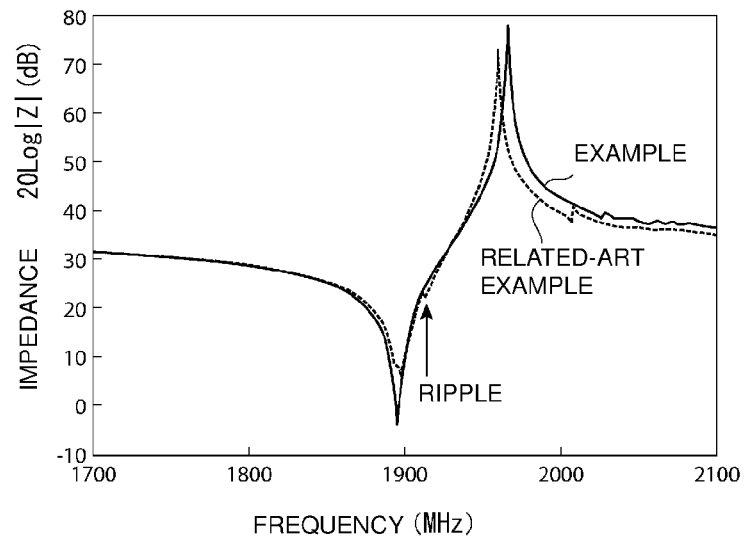
FIG. 2 illustrates the resonance characteristics of elastic wave devices according to the first preferred embodiment of the present invention and a related-art example.

FIG. 2 illustrates the resonance characteristics of the example according to the above-described preferred embodiment in a solid line. For comparison, an elastic wave device was produced in the same manner as in the example of the above-described preferred embodiment, except that the bonding layer 7 was disposed in the first silicon oxide film 3. FIG. 2 also illustrates the resonance characteristics of the elastic wave device of the related-art example in a broken line. As is clear from FIG. 2, ripples appear between the resonance point and the antiresonance point in the related-art example. In contrast, such ripples do not appear between the resonance point and the antiresonance point in the example of the above-described preferred embodiment. Furthermore, the waveform at the resonance point is sharper in the example of the above-described preferred embodiment than in the related-art example, and the peak-to-valley ratio of the impedance characteristics is also large.

As described above, it is believed that the resonance characteristics in the example of the above-described preferred embodiment are improved as compared to the resonance characteristics in the related-art example because microcracks based on the warpage described above are not formed.

Figure 3:
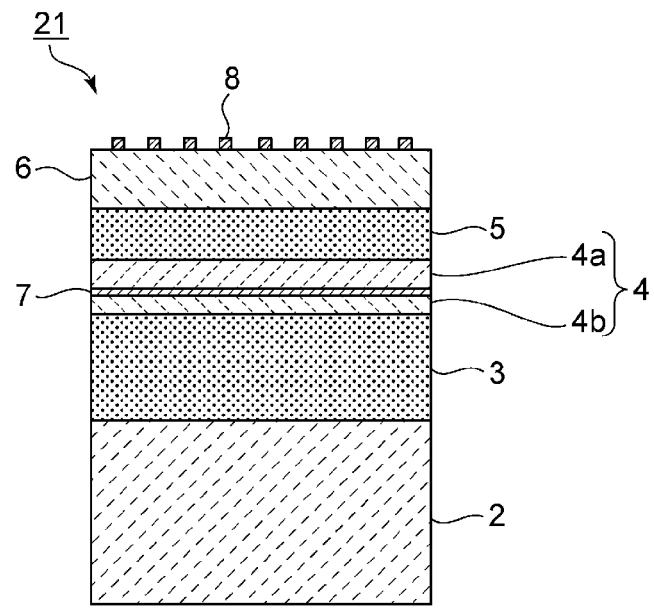
FIG. 3 is a schematic elevational cross-sectional view of an elastic wave device according to a second preferred embodiment of the present invention.

FIG. 3 is a schematic elevational cross-sectional view of an elastic wave device according to a second preferred embodiment of the present invention.

In an elastic wave device 21 according to the second preferred embodiment, a first silicon oxide film 3, a high-acoustic-velocity film 4, a low-acoustic-velocity film 5, a piezoelectric film 6, and an IDT electrode 8 are stacked on a supporting substrate 2. In the elastic wave device 21 of the second preferred embodiment, a bonding layer 7 is provided in the high-acoustic-velocity film 4. That is, the high-acoustic-velocity film 4 includes high-acoustic-velocity layers 4a and 4b, and the bonding layer 7 is provided between the high-acoustic-velocity layer 4a and the high-acoustic-velocity layer 4b.

In the present preferred embodiment, a second multilayer body in which a low-acoustic-velocity film and a high-acoustic-velocity layer are disposed on a piezoelectric film may be provided in the production. Therefore, warpage is unlikely to occur in the piezoelectric film. This prevents degradation of the electrical characteristics of the elastic wave device 21 as in the first preferred embodiment and also prevents fractures of the piezoelectric film from occurring at the stage of a wafer or in the elastic wave device 21.

Figure 4:
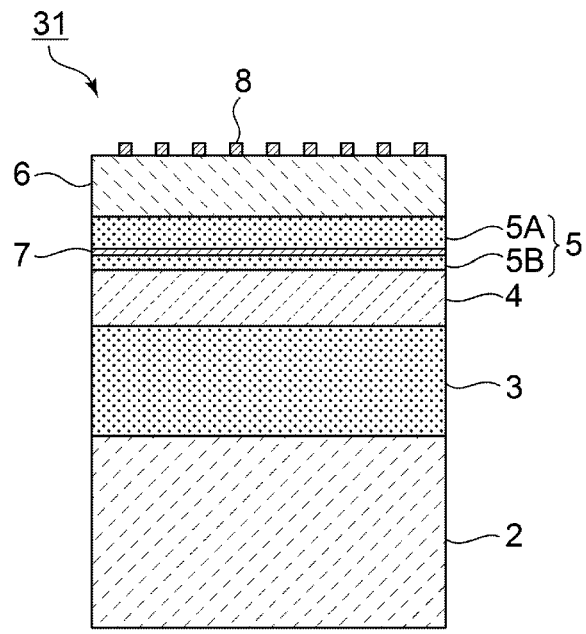
FIG. 4 is a schematic elevational cross-sectional view of an elastic wave device according to a third preferred embodiment of the present invention.

FIG. 4 is a schematic elevational cross-sectional view of an elastic wave device according to a third preferred embodiment of the present invention.

In an elastic wave device 31 according to the third preferred embodiment, a first silicon oxide film 3, a high-acoustic-velocity film 4, a second silicon oxide film 5B, a bonding layer 7, a third silicon oxide film 5A, a piezoelectric film 6, and an IDT electrode 8 are stacked on a supporting substrate 2 in this order. The second silicon oxide film 5B and the third silicon oxide film 5A each define a low-acoustic-velocity film. In the present preferred embodiment, the bonding layer 7 is located at an interface between the second silicon oxide film 5B and the third silicon oxide film 5A.

In the present preferred embodiment, a second multilayer body including a piezoelectric film may be provided in the production. Therefore, warpage in unlikely to occur in the piezoelectric film. This prevents degradation of the electrical characteristics of the elastic wave device 31 and also prevents fractures of the piezoelectric film from occurring at the stage of a wafer or in the elastic wave device 31.

Figure 5:
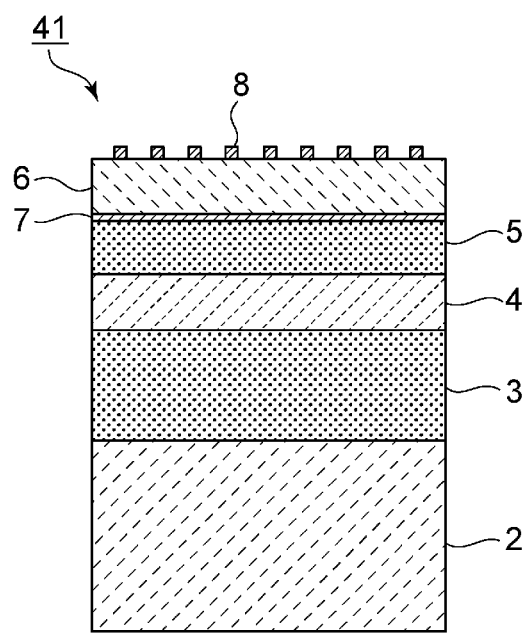
FIG. 5 is a schematic elevational cross-sectional view of an elastic wave device according to a fourth preferred embodiment of the present invention.

FIG. 5 is a schematic elevational cross-sectional view of an elastic wave device according to a fourth preferred embodiment of the present invention.

In an elastic wave device 41 according to the fourth preferred embodiment, a first silicon oxide film 3, a high-acoustic-velocity film 4, a low-acoustic-velocity film 5, a piezoelectric film 6, and an IDT electrode 8 are stacked on a supporting substrate 2. A bonding layer 7 is provided at an interface between the low-acoustic-velocity film 5 and the piezoelectric film 6.

In the present preferred embodiment, a second multilayer body including a piezoelectric film may be provided in the production. Therefore, warpage is unlikely to occur in the piezoelectric film. This prevents degradation of the electrical characteristics of the elastic wave device 41 and prevents fractures of the piezoelectric film from occurring at the stage of a wafer or in the elastic wave device 41.

As in the elastic wave devices according to the first to fourth preferred embodiments, the bonding layer 7 may be disposed at any position from the inside of the high-acoustic-velocity film 4 to the interface between the low-acoustic-velocity film 5 and the piezoelectric film 6.

Figure 6:
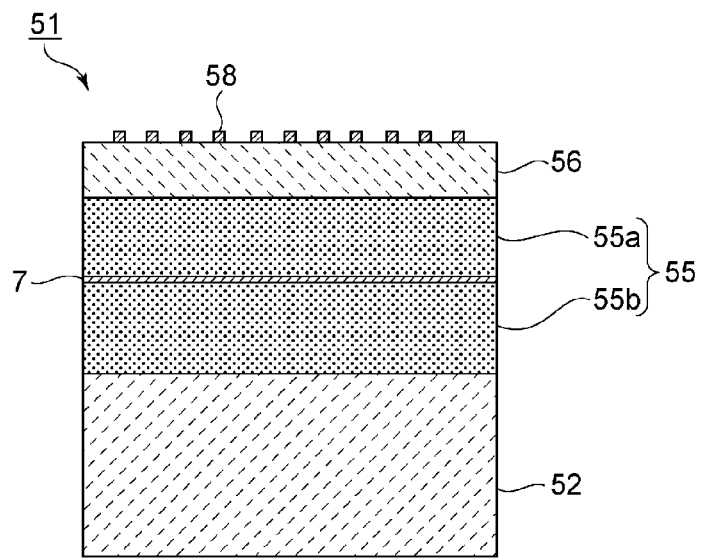
FIG. 6 is a schematic elevational cross-sectional view of an elastic wave device according to a fifth preferred embodiment of the present invention.

FIG. 6 is a schematic elevational cross-sectional view of an elastic wave device according to a fifth preferred embodiment of the present invention.

In an elastic wave device 51, a low-acoustic-velocity film 55 is stacked on a high-acoustic-velocity substrate 52. A piezoelectric film 56 is stacked on the low-acoustic-velocity film 55. An IDT electrode 58 is provided on the piezoelectric film 56. Although not particularly illustrated, reflectors are disposed on both sides of the IDT electrode 58 in a propagation direction of the elastic wave, thus defining a one-port elastic wave resonator.

In the present preferred embodiment, the high-acoustic-velocity substrate 52 is provided, and a high-acoustic-velocity film is not separately provided. Since the low-acoustic-velocity film 55 and the high-acoustic-velocity substrate 52 are stacked below the piezoelectric film 56, the Q factor is also increased in the present preferred embodiment. In this manner, the high-acoustic-velocity substrate 52 may define both of a high-acoustic-velocity film and a supporting substrate.

The high-acoustic-velocity substrate 52 is made of an appropriate material in which the acoustic velocity of a bulk wave is higher than that of an elastic wave that propagates through the piezoelectric film 56. In the present preferred embodiment, the high-acoustic-velocity substrate 52 is preferably made of Si, for example. The high-acoustic-velocity substrate 52 may be made of an appropriate material that satisfies the above-described condition.

A bonding layer 7 is located in the low-acoustic-velocity film 55 that is preferably made of silicon oxide, for example. That is, the bonding layer 7 is disposed at an interface between a first low-acoustic-velocity layer 55a and a second low-acoustic-velocity layer 55b. Therefore, a second multilayer body obtained by stacking the IDT electrode 58 and the first low-acoustic-velocity layer 55a on the piezoelectric film 56 may be provided in the production. Consequently, a large membrane stress is not applied to the piezoelectric film 56 in the second multilayer body. Therefore, warpage is unlikely to occur in the piezoelectric film.

In the production, a metal layer including Ti or Al, for example, is formed on a surface of the second multilayer body at which the low-acoustic-velocity layer is exposed. Then, a first multilayer body in which a low-acoustic-velocity layer is stacked on a mother high-acoustic-velocity substrate is provided. A metal layer preferably made of Ti or other suitable material is formed on the low-acoustic-velocity layer of the first multilayer body. Then, the first and second multilayer bodies are bonded to each other under heating by bringing the metal layers into contact with each other. Thus, the bonding layer 7 is formed in the same or substantially the same manner as in the elastic wave device 1 according to the first preferred embodiment.

Subsequently, the mother multilayer body may be cut into individual elastic wave devices 51.

In the present preferred embodiment, since the bonding layer 7 is disposed at the above-described position, warpage is unlikely to occur at the stage of a mother piezoelectric film during the production. This prevents degradation of the electrical characteristics and prevents fractures and microcracking of the piezoelectric film 56 from occurring at the stage of a mother multilayer body and during the conveyance of products.

Figure 7:
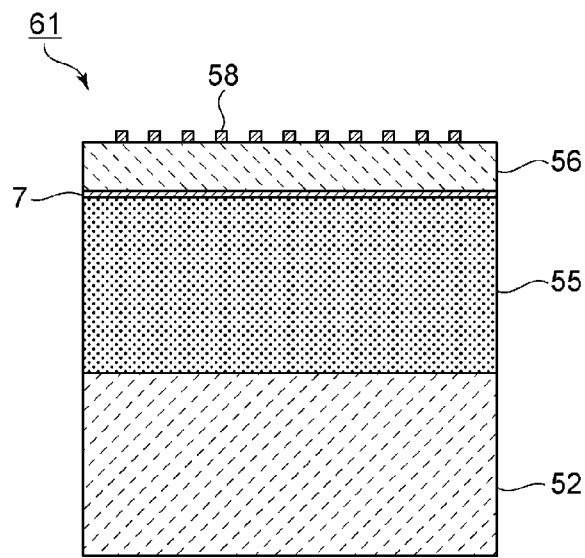
FIG. 7 is a schematic elevational cross-sectional view of an elastic wave device according to a sixth preferred embodiment of the present invention.

FIG. 7 is a schematic elevational cross-sectional view of an elastic wave device according to a sixth preferred embodiment of the present invention. In an elastic wave device 61, the bonding layer 7 is located at an interface between a piezoelectric film 56 and a low-acoustic-velocity film 55. The elastic wave device 61 is the same or substantially the same as the elastic wave device 51, except for this point.

In the elastic wave device 61, the bonding layer 7 is disposed at a position closer to the piezoelectric film 56. Therefore, warpage is unlikely to occur in the piezoelectric film 56 at the stage of a second multilayer body before bonding. This prevents degradation of the electrical characteristics as in the elastic wave device 51 of the fifth preferred embodiment.

Furthermore, since warpage is unlikely to occur in the piezoelectric film 56 in the production process, fractures and microcracking are unlikely to occur. Since warpage is also unlikely to occur in the piezoelectric film 56 during the conveyance of products, fractures and microcracking are unlikely to occur.

In the structure including the high-acoustic-velocity substrate 52 as in the elastic wave devices 51 and 61, another intermediate layer may be stacked between the high-acoustic-velocity substrate 52 and the low-acoustic-velocity film 55. That is, the low-acoustic-velocity film 55 may be indirectly stacked above the high-acoustic-velocity substrate. In either case, in the structure including the high-acoustic-velocity substrate 52, the bonding layer 7 may be located in the low-acoustic-velocity film 55 or at an interface between the piezoelectric film 56 and the low-acoustic-velocity film 55.

Next, the relationship between the thickness of the low-acoustic-velocity film and the Q factor will be described below.

Various elastic wave devices were produced by changing the thickness of the first low-acoustic-velocity layer 55a of the elastic wave device 51 according to the fifth preferred embodiment illustrated in FIG. 6. More specifically, a high-acoustic-velocity substrate 52 made of Si was used. A $SiO_2$ film having a thickness of about 55 nm was used as the second low-acoustic-velocity layer 55b. A Ti film having a thickness of about 0.5 nm was used as the bonding layer 7. A $LiTaO_3$ film having a thickness of about 600 nm was used as the piezoelectric film 56. The wavelength λ determined by a pitch of electrode fingers of an ITD electrode was about 2 μm. The first low-acoustic-velocity layer 55a in contact with the piezoelectric film 56 was made of silicon oxide ($SiO_2$) and formed so as to have different thicknesses.

Figure 8:
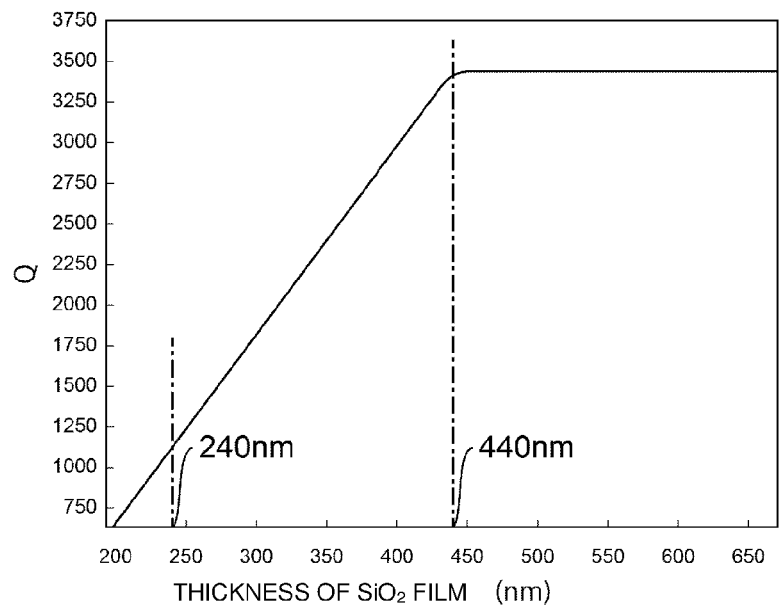
FIG. 8 illustrates the relationship between the thickness of a $SiO_2$ film and the Q factor.

FIG. 8 illustrates the relationship between the thickness of a $SiO_2$ film serving as the low-acoustic-velocity layer 55a and the Q factor.

The Q factor increases as the thickness of the $SiO_2$ film defining the low-acoustic-velocity layer 55a increases. When the thickness of the $SiO_2$ film is about 240 nm or more, that is, about 0.12λ or more, a high Q factor of more than about 1000 is achieved. When the thickness of the $SiO_2$ film is about 440 nm or more, that is, about 0.22λ or more, the Q factor hardly varies and is substantially constant. Therefore, by setting the thickness of the $SiO_2$ film to about 0.22λ or more, the Q factor is further increased and the variation in the Q factor is prevented. When the low-acoustic-velocity layer in contact with the piezoelectric film 56 is made of silicon oxide, the thickness of the $SiO_2$ film is preferably about 0.12λ or more and more preferably about 0.22λ or more.

The thickness of the $SiO_2$ film defining the low-acoustic-velocity layer 55a is preferably about 2λ or less. This decreases the membrane stress.

Next, the relationship between the thickness of the Ti layer of the bonding layer and the Q factor will be described.

Various elastic wave devices were produced by changing the thickness of the Ti layer of the bonding layer 7 in the elastic wave device 31 according to the third preferred embodiment illustrated in FIG. 4. More specifically, the high-acoustic-velocity film 4 was made of Si. The bonding layer 7 was formed of a Ti layer and a Ti oxide layer. The bonding layer 7 was formed so that the Ti oxide layer was disposed at a position close to the high-acoustic-velocity film 4 and the Ti layer was disposed at a position close to the piezoelectric film 6. The thickness of the Ti oxide layer was about 50 nm. The low-acoustic-velocity film was made of $SiO_2$ and had a thickness of about 700 nm. The piezoelectric film 6 was made of $LiTaO_3$ and had a thickness of about 600 nm. The wavelength λ of a surface acoustic wave serving as an elastic wave used in the elastic wave device 31 was about 2 μm.

Figure 9:
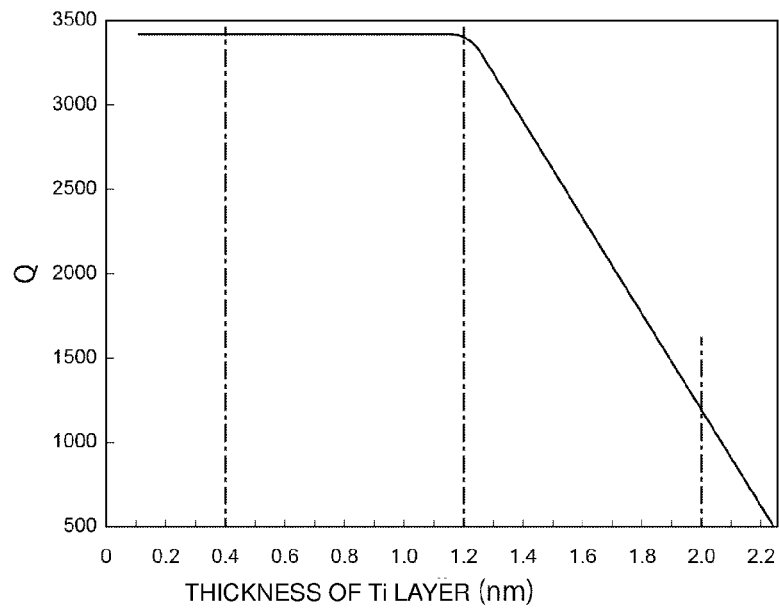
FIG. 9 illustrates the relationship between the thickness of a Ti layer of a bonding layer and the Q factor.

FIG. 9 illustrates the relationship between the thickness of the Ti layer of the bonding layer and the Q factor.

The Q factor increases as the thickness of the Ti layer of the bonding layer decreases. In particular, when the thickness of the Ti layer is about 2.0 nm or less, that is, about $1\times10^{-3}\lambda$ or less, a high Q factor of more than about 1000 is achieved. When the thickness of the Ti layer is about 1.2 nm or less, that is, about $0.6\times10^{-3}\lambda$ or less, the Q factor hardly varies and is substantially constant. Therefore, by setting the thickness of the Ti layer of the bonding layer to about 1.2 nm or less or about $0.6\times10^{-3}\lambda$ or less, the Q factor is further increased and the variation in the Q factor is prevented. The thickness of the Ti layer is preferably about 2.0 nm or less and more preferably about 1.2 nm or less.

The thickness of the Ti layer is preferably about 0.4 nm or more. This achieves suitable bonding between the first multilayer body and the second multilayer body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
    a piezoelectric film;
    a low-acoustic-velocity film which is stacked on the piezoelectric film and in which an acoustic velocity of a bulk wave that propagates through the low-acoustic- velocity film is lower than an acoustic velocity of a bulk wave that propagates through the piezoelectric film;

a high-acoustic-velocity film which is stacked on a surface of the low-acoustic-velocity film on a side opposite to the piezoelectric film and in which an acoustic velocity of a bulk wave that propagates through the high-acoustic-velocity film is higher than an acoustic velocity of an elastic wave that propagates through the piezoelectric film;

a substrate directly or indirectly stacked on a surface of the high-acoustic-velocity film on a side opposite to the low-acoustic-velocity film; and a bonding layer disposed at any position from an inside of the high-acoustic-velocity film to an interface between the low-acoustic-velocity film and the piezoelectric film.

2. The elastic wave device according to claim 1, wherein the bonding layer is located in the high-acoustic-velocity film, at an interface between the high-acoustic-velocity film and the low-acoustic-velocity film, in the low-acoustic-velocity film, or at the interface between the low-acoustic-velocity film and the piezoelectric film.

3. The elastic wave device according to claim 1, wherein the bonding layer includes a metal oxide layer or a metal nitride layer.

4. The elastic wave device according to claim 1, wherein the bonding layer includes a Ti layer, and the Ti layer has a thickness in a range of about 0.4 nm to about 2.0 nm.

5. The elastic wave device according to claim 4, wherein the Ti layer has a thickness a range of about 0.4 nm to about 1.2 nm.

6. The elastic wave device according to claim 1, wherein the piezoelectric film is made of LiTaO$_3$.

7. The elastic wave device according to claim 1, wherein the low-acoustic-velocity film is made of silicon oxide.

8. The elastic wave device according to claim 2, wherein
the low-acoustic-velocity film is made of silicon oxide; and
the bonding layer is located in the low-acoustic-velocity film;
the low-acoustic-velocity film includes a first low-acoustic-velocity layer located on a side of the bonding layer close to the piezoelectric film and a second low-acoustic-velocity layer located on a side of the bonding layer opposite to the piezoelectric film; and
when an elastic wave used in the elastic wave device is assumed to have a wavelength $\lambda$, the first low-acoustic-velocity layer has a thickness of about 0.12$\lambda$ or more.

9. The elastic wave device according to claim 8, wherein the first low-acoustic-velocity layer has a thickness of about 0.22$\lambda$ or more.

10. The elastic wave device according to claim 1, wherein the high-acoustic-velocity film is made of aluminum nitride or silicon nitride.

11. The elastic wave device according to claim 1, further comprising an intermediate layer stacked between the high-acoustic-velocity film and the substrate.

12. An elastic wave device comprising:
a piezoelectric film;
a low-acoustic-velocity film which is stacked on the piezoelectric film and in which an acoustic velocity of a bulk wave that propagates through the low-acoustic-velocity film is lower than an acoustic velocity of a bulk wave that propagates through the piezoelectric film;
a high-acoustic-velocity substrate which is directly or indirectly stacked on a surface of the low-acoustic-velocity film on a side opposite to the piezoelectric film and in which an acoustic velocity of a bulk wave that propagates through the high-acoustic-velocity substrate is higher than an acoustic velocity of an elastic wave that propagates through the piezoelectric film; and
a bonding layer located in the low-acoustic-velocity film or at an interface between the piezoelectric film and the low-acoustic-velocity film.

13. The elastic wave device according to claim 12, wherein the bonding layer is located in the high-acoustic-velocity substrate, at an interface between the high-acoustic-velocity substrate and the low-acoustic-velocity film, in the low-acoustic-velocity film, or at the interface between the low-acoustic-velocity film and the piezoelectric film.

14. The elastic wave device according to claim 12, wherein the bonding layer includes a metal oxide layer or a metal nitride layer.

15. The elastic wave device according to claim 12, wherein the bonding layer includes a Ti layer, and the Ti layer has a thickness in a range of about 0.4 nm to about 2.0 nm.

16. The elastic wave device according to claim 15, wherein the Ti layer has a thickness a range of about 0.4 nm to about 1.2 nm.

17. The elastic wave device according to claim 12, wherein the piezoelectric film is made of LiTaO$_3$.

18. The elastic wave device according to claim 12, wherein the low-acoustic-velocity film is made of silicon oxide.

19. The elastic wave device according to claim 13, wherein
the low-acoustic-velocity film is made of silicon oxide; and
the bonding layer is located in the low-acoustic-velocity film;
the low-acoustic-velocity film includes a first low-acoustic-velocity layer located on a side of the bonding layer close to the piezoelectric film and a second low-acoustic-velocity layer located on a side of the bonding layer opposite to the piezoelectric film; and
when an elastic wave used in the elastic wave device is assumed to have a wavelength $\lambda$, the first low-acoustic-velocity layer has a thickness of about 0.12$\lambda$, or more.

20. The elastic wave device according to claim 19, wherein the first low-acoustic-velocity layer has a thickness of about 0.22$\lambda$ or more.

21. The elastic wave device according to claim 12, wherein the high-acoustic-velocity film is made of aluminum nitride or silicon nitride.

22. The elastic wave device according to claim 12, further comprising an intermediate layer stacked between the high-acoustic-velocity film and the substrate.

* * * * *